US010648080B2

(12) United States Patent
White

(10) Patent No.: US 10,648,080 B2
(45) Date of Patent: May 12, 2020

(54) FULL-AREA COUNTER-FLOW HEAT EXCHANGE SUBSTRATE SUPPORT

(71) Applicant: Applied Materials, Inc., Santa Clara, CA (US)

(72) Inventor: John M. White, Hayward, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 692 days.

(21) Appl. No.: 15/149,063

(22) Filed: May 6, 2016

(65) Prior Publication Data

US 2017/0321323 A1    Nov. 9, 2017

(51) Int. Cl.
*C23C 16/458*    (2006.01)
*C23C 16/505*    (2006.01)
(Continued)

(52) U.S. Cl.
CPC .......... *C23C 16/4586* (2013.01); *C23C 16/46* (2013.01); *C23C 16/505* (2013.01);
(Continued)

(58) Field of Classification Search
CPC . H04L 7/0334; H03M 1/1215; H03M 1/1245; C23C 16/4586; C23C 16/46; C23C 16/505; H01J 37/32715; H01J 37/32724; H01J 2237/3321; F28F 9/026; F28F 2250/10; F28D 15/00; H01L 21/6835;
(Continued)

(56) References Cited

U.S. PATENT DOCUMENTS 8,238,072 B2    8/2012  Fujisawa et al.
2006/0076108 A1  4/2006  Holland et al.
(Continued)

FOREIGN PATENT DOCUMENTS

CN    1779938 A    5/2006
JP    2005268720 A    9/2005
(Continued)

OTHER PUBLICATIONS

International Search Report and Written Opinion for Application No. PCT/US2017/028295 dated Sep. 26, 2017.
(Continued)

*Primary Examiner* — Kambiz Zand
*Assistant Examiner* — Mirza Israr Javed
(74) *Attorney, Agent, or Firm* — Patterson + Sheridan, LLP

(57) ABSTRACT

Embodiments described herein generally relate to a temperature control system in a substrate support assembly. In one embodiment, a substrate support assembly is disclosed. The substrate support assembly includes a support plate assembly The support plate assembly includes a first fluid supply manifold, a second fluid supply manifold, a first fluid return manifold, a second fluid return manifold, a plurality of first fluid passages, a plurality of second fluid passages, and a fluid supply conduit. The plurality of first fluid passages extend from the first fluid supply manifold to the first fluid return manifold. The plurality of second fluid passages extend from the second fluid supply manifold to the second fluid return manifold. The plurality of fluid passages extend across an upper surface of the support plate assembly in an alternating manner. The fluid supply conduit is configured to supply a fluid to the fluid supply manifolds.

20 Claims, 10 Drawing Sheets

(51) Int. Cl.
    *C23C 16/46*     (2006.01)
    *H01J 37/32*     (2006.01)
    *H01L 51/00*     (2006.01)
    *F28D 15/00*     (2006.01)
    *F28F 9/02*     (2006.01)

(52) U.S. Cl.
    CPC .............. *F28D 15/00* (2013.01); *F28F 9/026* (2013.01); *H01J 37/32715* (2013.01); *H01J 37/32724* (2013.01); *H01L 51/00* (2013.01); *F28F 2250/10* (2013.01); *H01J 2237/3321* (2013.01)

(58) Field of Classification Search
    CPC ......... H01L 21/67248; H01L 21/67098; H01L 21/67017; H01L 21/02274; H01L 51/00
    See application file for complete search history.

(56) References Cited

U.S. PATENT DOCUMENTS

2006/0076109 A1     4/2006     Holland et al.
2015/0364350 A1     12/2015     White et al.

FOREIGN PATENT DOCUMENTS

| | | |
|---|---|---|
| JP | 2012019164 A | 1/2012 |
| JP | 2012099825 A | 5/2012 |
| JP | 2013026561 A | 2/2013 |
| KR | 100730381 B1 | 6/2007 |
| KR | 100987304 B1 | 10/2010 |
| KR | 20130044291 A | 5/2013 |
| WO | 9941778 A1 | 8/1999 |

OTHER PUBLICATIONS

Japan Office Action dated Feb. 25, 2020 for Application No. 2018-558154.
Korean Office Action dated Feb. 11, 2020 for Application No. 10-2018-7035275.
Japanese Office Action dated Oct. 23, 2019 for Application No. 2018-558154.
Taiwan Office Action dated Mar. 10, 2020 for Application No. 106113074.

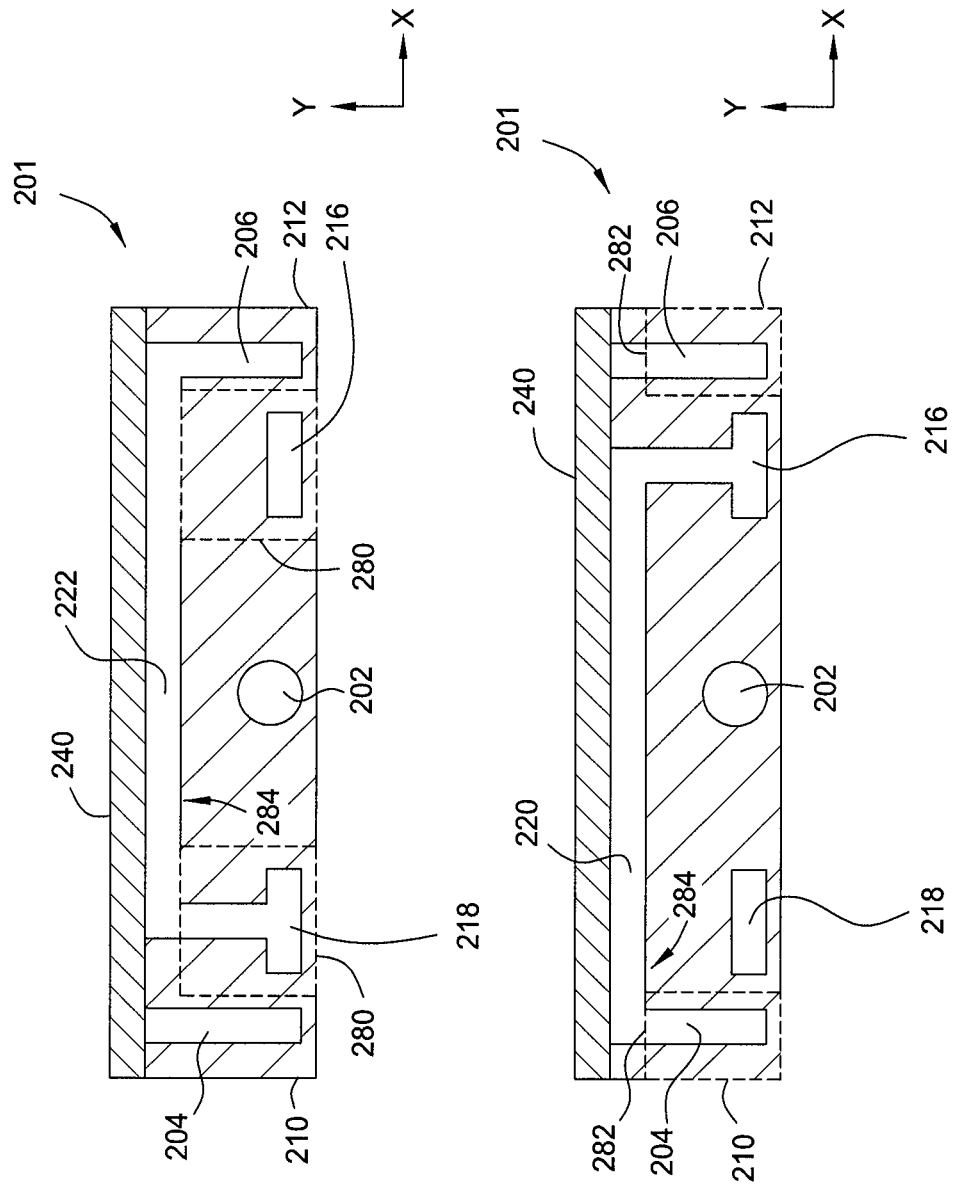

FULL-AREA COUNTER-FLOW HEAT EXCHANGE SUBSTRATE SUPPORT

BACKGROUND

Field

Embodiments described herein generally relate to a temperature control system in a substrate support assembly.

Description of the Related Art

Flat panel displays (FPD) are commonly used for active matrix displays such as computer and television monitors, personal digital assistants (PDAs), and cell phones, as well as solar cells and the like. Plasma enhanced chemical vapor deposition (PECVD) may be employed in flat panel display fabrication to deposit thin film on a substrate. PECVD is generally accomplished by introducing a precursor gas into a plasma within a vacuum process chamber and depositing a film on a substrate from the excited precursor gas.

In addition, after striking a plasma inside a PECVD chamber, the energy from the plasma also creates heat directed toward the substrate and a substrate support that supports the substrate within the chamber. Thus, controlling a temporal temperature increase of the substrate support during processing is a challenge.

Thus, there is a need for a substrate support assembly having improved temperature control.

SUMMARY

Embodiments described herein generally relate to a temperature control system in a substrate support assembly. In one embodiment, a substrate support assembly is disclosed herein. The substrate support assembly includes a support plate assembly. The support plate assembly includes a first fluid supply manifold, a second fluid supply manifold, a first fluid return manifold, a second fluid return manifold, a plurality of first fluid passages, a plurality of second fluid passages, and a fluid supply conduit. The first fluid supply manifold is positioned at a first end of the substrate support. The second fluid supply manifold positioned at a second end of the substrate support. The second end is opposite the first end. The first fluid return manifold is positioned at the second end of the substrate support. The second fluid return manifold positioned at the first end of the substrate support. The plurality of first fluid passages extend from the first fluid supply manifold to the first fluid return manifold. The plurality of second fluid passages extend from the second fluid supply manifold to the second fluid return manifold. The first fluid passages and the second fluid passages extend across an upper surface of the substrate support in an approximately alternating manner. The fluid supply conduit is configured to supply a fluid to the first fluid supply manifold and the second fluid supply manifold.

In another embodiment, a processing chamber is disclosed herein. The processing chamber includes a chamber body and a substrate support assembly. The chamber body includes a top wall, a sidewall, and a bottom wall defining a processing region in the chamber body. The substrate support assembly is disposed on the processing region. The substrate support assembly includes a support plate assembly. The support plate assembly includes a first fluid supply or return manifold, a second fluid supply or return manifold, a first fluid return or supply manifold, a second fluid return or supply manifold, a plurality of first fluid passages, a plurality of second fluid passages, and a fluid supply conduit. The first fluid supply or return manifold is positioned at a first end of the substrate support. The second fluid supply or return manifold positioned at a second end of the substrate support. The second end is opposite the first end. The first fluid return or supply manifold is positioned at the second end of the substrate support. The second fluid return or supply manifold positioned at the first end of the substrate support. The plurality of first fluid passages extend from the first fluid supply or return manifold to the first fluid return or supply manifold. The plurality of second fluid passages extend from the second fluid supply or return manifold to the second fluid return or supply manifold. The first fluid passages and the second fluid passages extend across an upper surface of the substrate support in a generally alternating manner. The fluid supply conduit is configured to supply a fluid to the first fluid supply or return manifold and the second fluid supply or return manifold.

In another embodiment, a method of controlling a temperature of a substrate support assembly is disclosed herein. The method includes providing a heat transfer fluid to a support plate assembly of the substrate support assembly. The heat transfer fluid is flowed in a first direction through a plurality of first fluid passages from a first end of the support plate assembly to a second end of the support plate assembly. The heat transfer fluid is flowed in a second direction through a plurality of second fluid passages from the second end of the support plate assembly to the first end of the support plate assembly. The plurality of first fluid passages and the plurality of second fluid passages are interleaved across an upper surface of the support plate assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B illustrates a cross-sectional view of the substrate support assembly of FIG. 2A, taken across the B-B line.

FIG. 2C illustrates a cross-sectional view of the substrate support assembly of FIG. 2A, taken across the C-C line.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
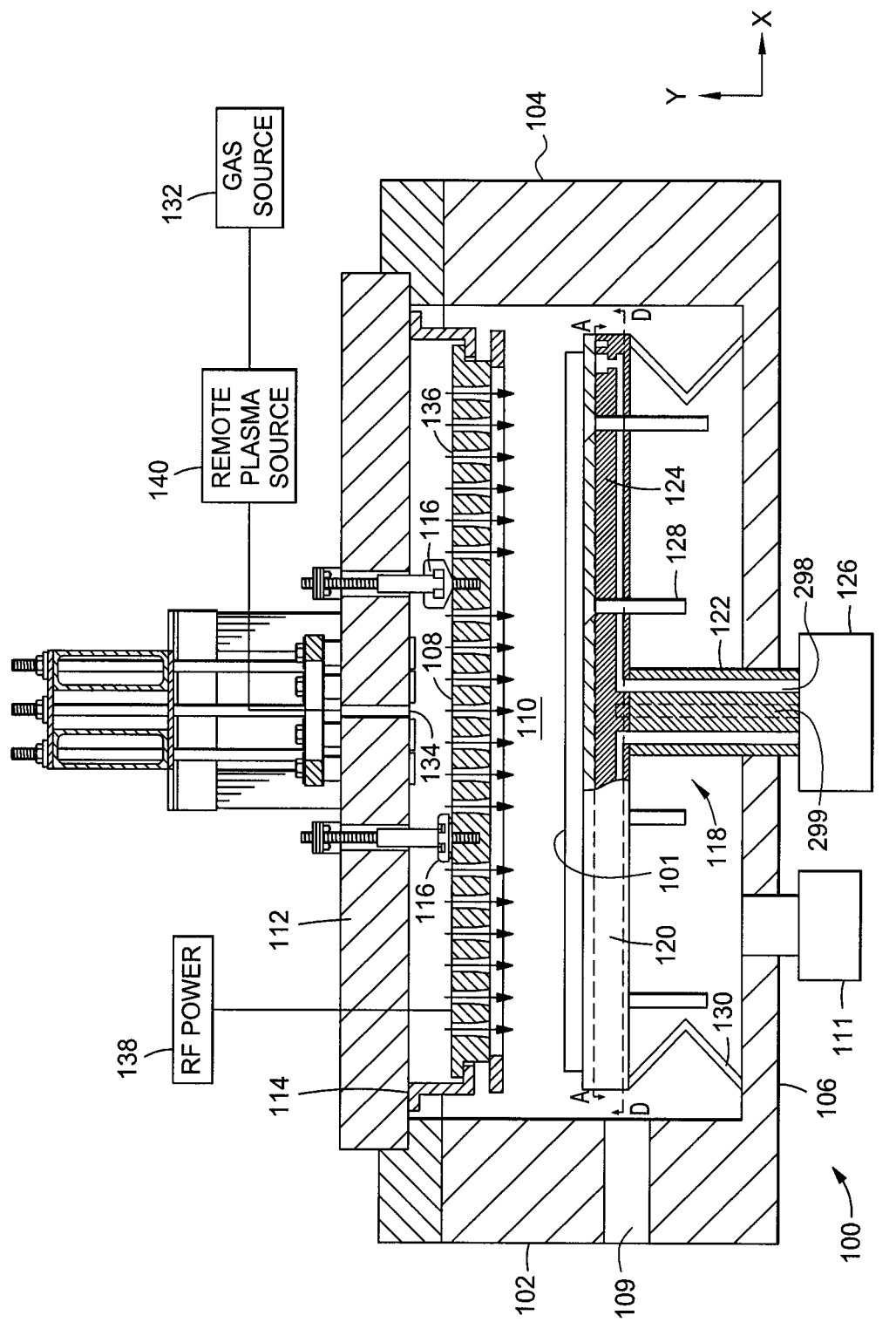
FIG. 1 illustrates a cross-sectional view of a processing chamber having a substrate support assembly disposed therein, according to one embodiment.

FIG. 1 illustrates a cross-sectional view of a processing chamber 100 having a substrate support assembly 118, according to one embodiment. The processing chamber 100 may include a chamber body 102 having sidewalls 104, and a bottom 106 that define a processing volume 110. The processing volume 110 is accessed through an opening 109 formed through the sidewalls 104.

A showerhead 108 is disposed in the processing volume 110. The showerhead 108 may be coupled to a backing plate 112. For example, the showerhead 108 may be coupled to the backing plate 112 by a suspension 114 at the end of the backing plate 112. One or more coupling supports 116 may be used to couple the showerhead 108 to the backing plate 112 to aid in preventing sag.

The substrate support assembly 118 is also disposed in the processing volume 110. The substrate support assembly 118 includes a support plate assembly 120 and a stem 122 coupled to the support plate assembly 120. The support plate assembly 120 is configured to support a substrate 101 during processing. The support plate assembly 120 includes a body assembly 201 having a plurality of first fluid passages 220 and a plurality of second fluid passages 222. The first and second fluid passages 220, 222 are configured to maintain the substrate support assembly 118 at a desired temperature. The first and second fluid passages 220, 222 extend a full plan area of the body assembly 201.

A lift system 126 may be coupled to the stem 122 to raise and lower the support plate assembly 120. Lift pins 128 are moveably disposed through the support plate assembly 120 to space the substrate 101 from the support plate assembly 120 to facilitate robotic transfer of the substrate 101. The substrate support assembly 118 may also include RF return straps 130 to provide an RF return path at an end of the substrate support assembly 118.

A gas source 132 may be coupled to the backing plate 112 to provide processing gas through a gas outlet 134 in the backing plate 112. The processing gas flows from the gas outlet 134 through gas passages 136 in the showerhead 108. A vacuum pump 111 may be coupled to the chamber 100 to control the pressure within the processing volume 110. An RF power source 138 may be coupled to the backing plate 112 and/or to the showerhead 108 to provide RF power to the showerhead 108. The RF power creates an electric field between the showerhead 108 and the substrate support assembly 118 so that a plasma may be generated from the gases between the showerhead 108 and the substrate support assembly 118.

A remote plasma source 140, such as an inductively coupled remote plasma source, may also be coupled between the gas source 132 and the backing plate 112. Between processing substrates, a cleaning gas may be provided to the remote plasma source 140 so that a remote plasma is generated and provided into the processing volume 110 to clean chamber components. The cleaning gas may be further excited while in the processing volume 110 by power applied to the showerhead 108 from the RF power source 138. Suitable cleaning gases include but are not limited to $NF_3$, $F_2$, and $SF_6$.

Figure 2A:
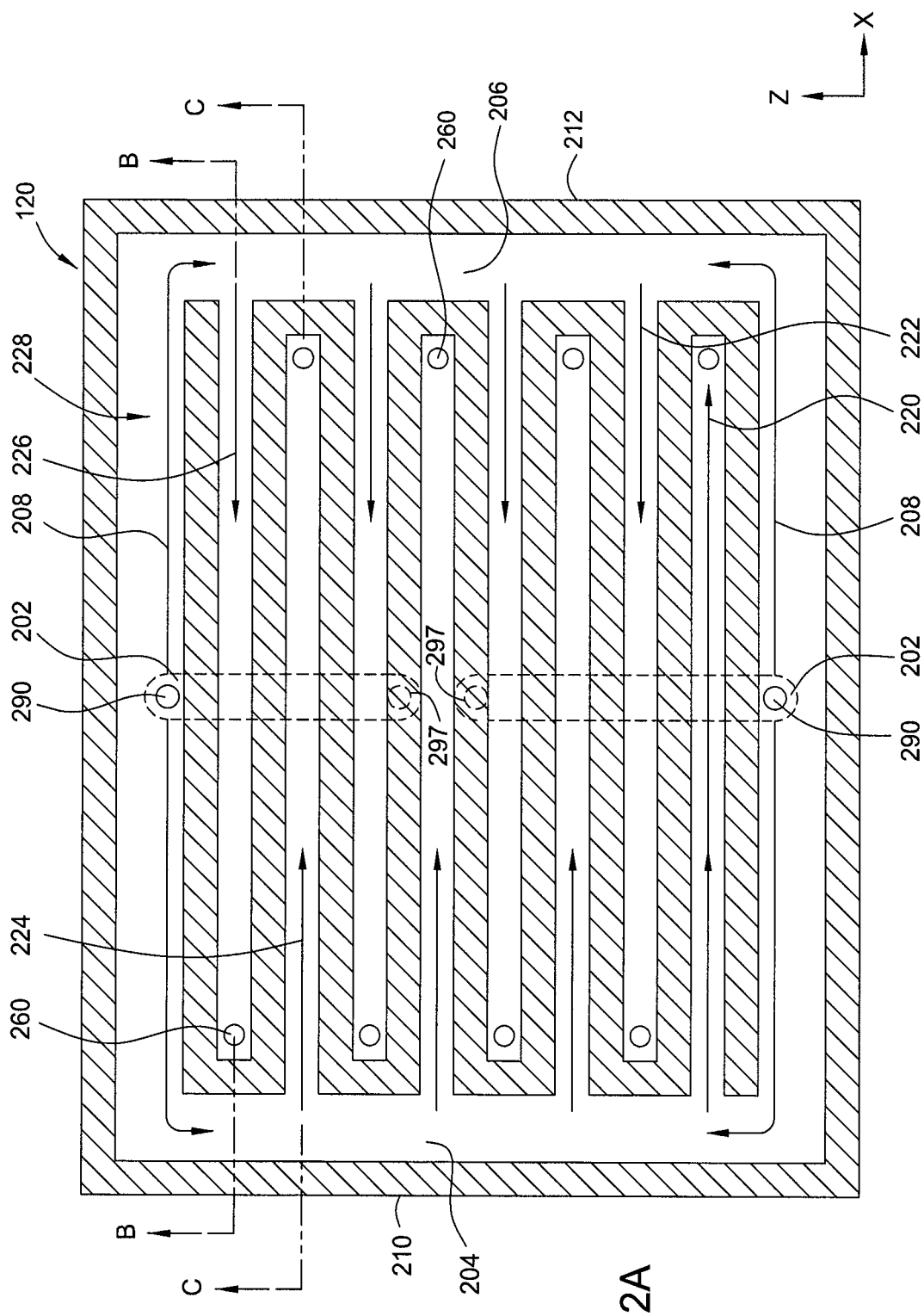
FIG. 2A illustrates a top cross-sectional view of the substrate support assembly of FIG. 1, according to one embodiment.
Figure 2D:
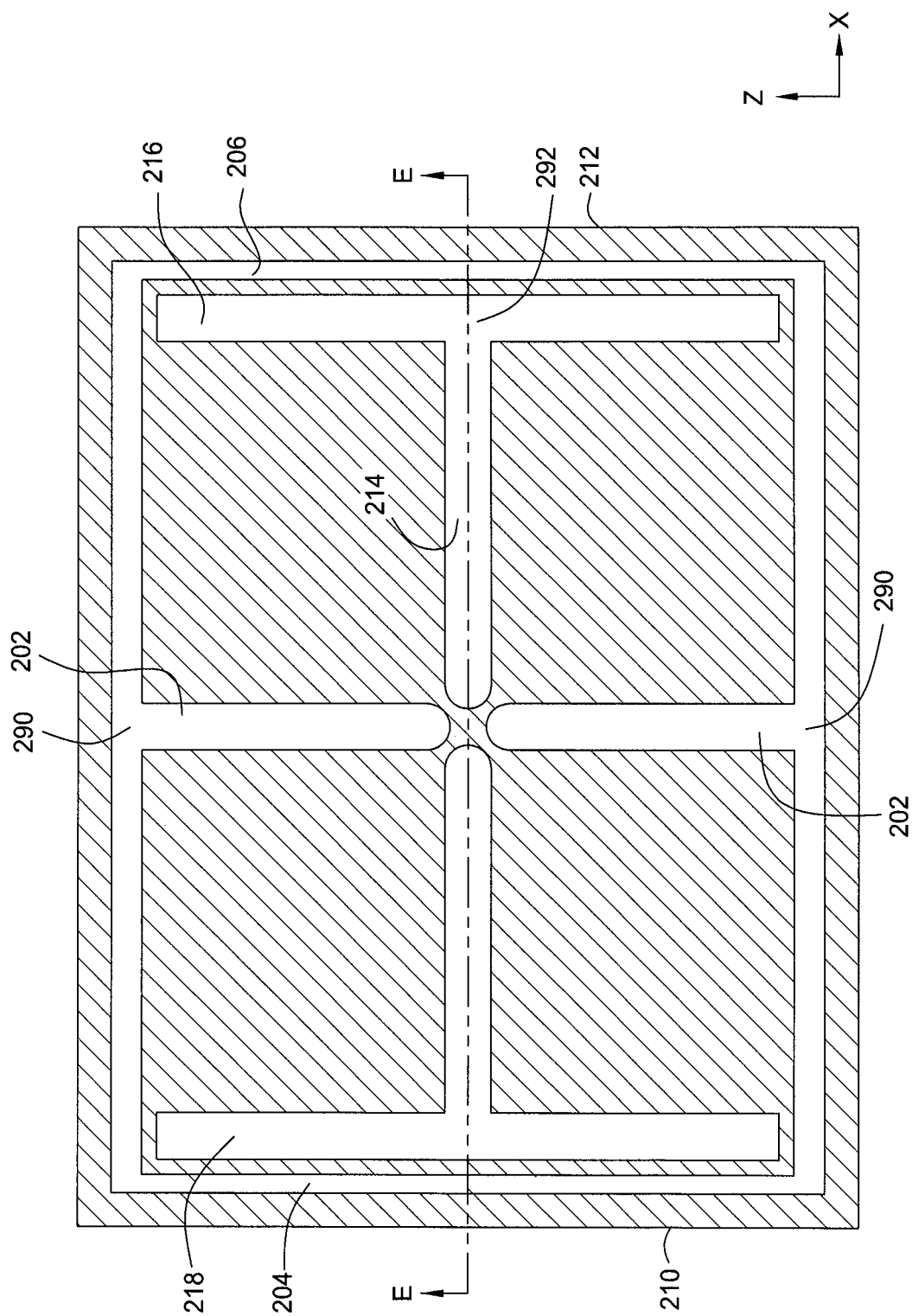
FIG. 2D illustrates a bottom cross-sectional view of the substrate support assembly of FIG. 1, taken across the D-D line.

FIG. 2A illustrates a top cross-sectional view of support plate assembly 120 of the substrate support assembly 118, according to one embodiment. FIG. 2D illustrates a bottom cross-sectional view of the support plate assembly 120 of the substrate support assembly 118, according to one example. The support plate assembly 120 includes the body assembly 201. The body assembly 201 includes the plurality of first fluid passages 220 and the plurality of second fluid passages 222. The first fluid passages 220 are configured to flow a heat transfer fluid in a first direction form a first end 210 of the body assembly 201 to a second end 212 of the body assembly 201. The second fluid passages 222 are configured to flow the heat transfer fluid in a second direction from the second end 212 to the first end 210, the second direction being opposite the first direction. In one embodiment, the first and second fluid passages 220, 222 run parallel to a long side of the body assembly 201. In another embodiment, the first and second fluid passages 220, 222 run perpendicular to the long side of the body assembly 201. The first fluid passages 220 are interleaved with the second fluid passages 222. Interleaving the first fluid passages 220 with the second fluid passages 222 provides flow paths arranged for flowing heat transfer fluid in alternating directions, thus configuring the support plate assembly 120 as a counter-flow heat exchanger. The alternating flow path for the heat transfer fluid allows for a more effective temperature control of the substrate support assembly 118, and ultimately the substrate 101.

In one embodiment, the body assembly 201 may further include a top plate (not shown) and a bottom plate (not shown) coupled with the top plate. As shown illustrated in FIG. 2A, the body assembly 201 is formed from a singular body. The body assembly 201 may further include a fluid supply conduit 202, a first fluid supply manifold 204, a second fluid supply manifold 206, and a fluid supply line 299. The fluid supply conduit 202 is in fluid communication with the first fluid supply manifold 204, the second fluid supply manifold 206, and the fluid supply line 299. The fluid supply conduit 202 includes an inlet 297 in fluid communication with the fluid supply conduit 202. The fluid supply conduit 202 also includes outlets 290 that is in communication with the first fluid supply manifold 204 and the second fluid supply manifold 206. The fluid supply conduit 202 is configured to supply a fluid, such as a heat transfer fluid, to the first and second fluid supply manifolds 204, 206. The direction of the fluid flow from the fluid supply conduit 202 to the first and second fluid supply manifolds 204, 206 are shown with an arrow 208. The first fluid supply manifold 204 is positioned at the first end 210 of the body assembly 201. The second fluid supply manifold 206 is positioned at the second end 212 of the body assembly 201. The second end 212 of the body assembly 201 is opposite the first end 210.

The body assembly 201 may further include a fluid exit conduit 214, a first fluid return manifold 216, a second fluid return manifold 218, and a fluid return line 298. The fluid exit conduit 214 is in fluid communication with the first fluid return manifold 216 and the second fluid return manifold 218. The fluid exit conduit 214 is configured to receive fluid from the first and second fluid return manifolds 216, 218 and remove the fluid from the support plate assembly 120. The fluid exit conduit 214 includes inlets 292, which are configured to remove the fluid from the support plate assembly 120. The fluid exit conduit 214 is in fluid communication with the fluid return line 298 that is positioned in the stem 122. The first fluid return manifold 216 is positioned at the second end 212 of the body assembly 201, interior to the second fluid supply manifold 206. The second fluid return manifold 218 is positioned at the first end 210 of the body assembly 201, interior to the first fluid supply manifold 204.

The plurality of first fluid passages 220 extend from the first fluid supply manifold 204 to the first fluid return manifold 216. Each first fluid passage 220 is configured to flow a fluid in a first direction 224 from the first fluid supply manifold 204 to the first fluid return manifold 216. The plurality of second fluid passages 222 extend from the second fluid supply manifold 206 to the second fluid return manifold 218. Each second fluid passage 222 is configured to flow a fluid in a second direction 226 from the second fluid supply manifold 206 to the second fluid return manifold 218. Each fluid passage 220, 222 includes an outlet 260, which is in fluid communication with a respective fluid return manifold 216, 218.

The first fluid passages 220 are interleaved with the second fluid passages 222. For example, the fluid passages 220, 222 are formed in the support plate assembly 120 in an alternating fashion across substantially the entire upper surface 228 of the support plate assembly 120. The alternating fluid passages 220, 222 allows for a more symmetric temperature control of support plate assembly 120. In one embodiment, the fluid passages 220, 222, fluid supply manifolds 204, 206, fluid return manifolds 216, 218, fluid supply conduit 202, and second fluid supply manifold 206 may be drilled into the body assembly 201. In another embodiment, the fluid passages 220, 222, fluid supply manifolds 204, 206, fluid return manifolds 216, 218, fluid supply conduit 202, and the second fluid supply manifold 206 may be machined. In this embodiment, a flat cap 240 may be brazed on top of the fluid passages 220, 222, fluid supply manifolds 204, 206, fluid return manifolds 216, 218, fluid supply conduit 202, and the second fluid supply manifold 206 to seal the fluid passages 220, 222, fluid supply manifolds 204, 206, fluid return manifolds 216, 218, fluid supply conduit 202, and the second fluid supply manifold 206.

FIG. 2B illustrates a cross-sectional view of the substrate support assembly 118, taken across the B-B line in FIG. 2A. FIG. 2B illustrates a second fluid passage 222 flowing from the second fluid supply manifold 206 to the second fluid return manifold 218. The fluid supply conduit 202 runs beneath the second fluid passage 222. In another embodiment, a cap 280 may be disposed on a bottom 284 of the fluid passages 220, 222. In this embodiment, the fluid passages 220, 222 are machined into the top surface of the body assembly 201. The first fluid return manifold 216 and the second fluid return manifold 218 may be machined into the cap 280. The cap 280 is coupled to the bottom of the fluid passages 220, 222 such that the fluid passages 220, 222 are in fluid communication with the fluid return manifolds 216, 218. The cap 280 may be configured to seal the fluid return manifolds 216, 218.

FIG. 2C illustrates a cross-sectional view of the support plate assembly 120, taken across the C-C line in FIG. 2A. FIG. 2C illustrates a first fluid passage 220 flowing from the first fluid supply manifold 204 to the first fluid return manifold 216. The fluid supply conduit 202 runs beneath the first fluid passage 220. In yet another embodiment, the flat cap 282 may be disposed on the bottom 284 of the fluid passages 220, 222. In this embodiment, the fluid passages 220, 222 are machined into the top surface of the body assembly 201. The first fluid supply manifold 204 and the second fluid supply manifold 206 may be machined into the cap 282. The cap 282 is coupled to the bottom 284 of the fluid passages 220, 222 such that the fluid passages 220, 222 are in fluid communication with the fluid supply manifolds 204, 206. The cap 282 may be configured to seal the fluid supply manifolds 204, 206.

Figure 2E:
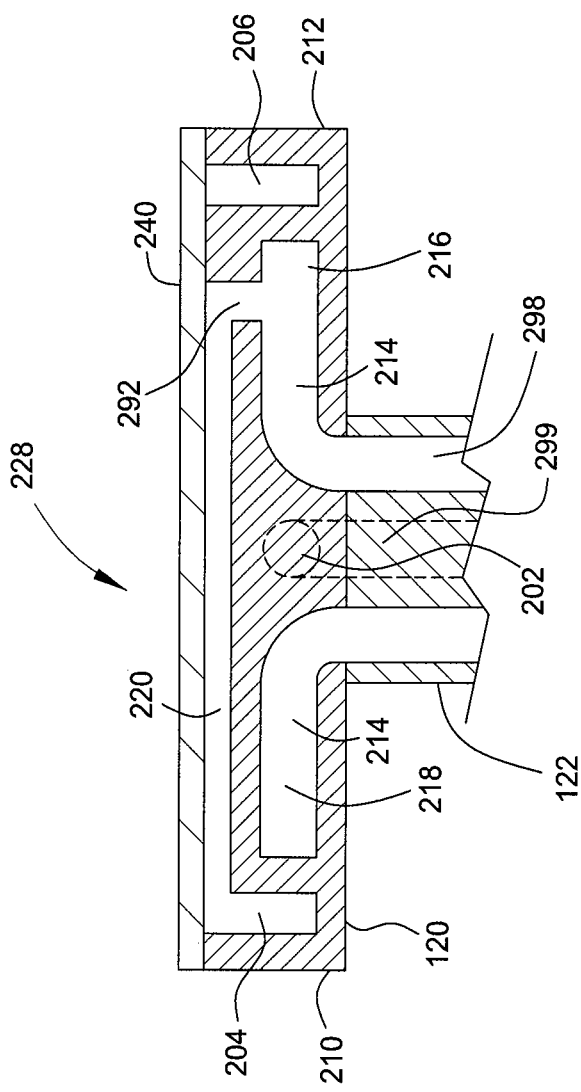
FIG. 2E illustrates a cross-sectional view of the substrate support assembly of FIG. 2D, taken across the E-E line.

FIG. 2E illustrates a cross-sectional view of the support plate assembly 120, taken across the E-E line in FIG. 2D. As illustrated in FIG. 2E, the fluid supply conduit 202 and the fluid exit conduit 214 extend into the stem 122 of the substrate support assembly 118. In FIG. 2E, the flat cap 240 is shown on the fluid passages 220, 222, fluid supply manifolds 204, 206, fluid return manifolds 216, 218, fluid supply conduit 202, and the second fluid supply manifold 206.

Figure 4A:
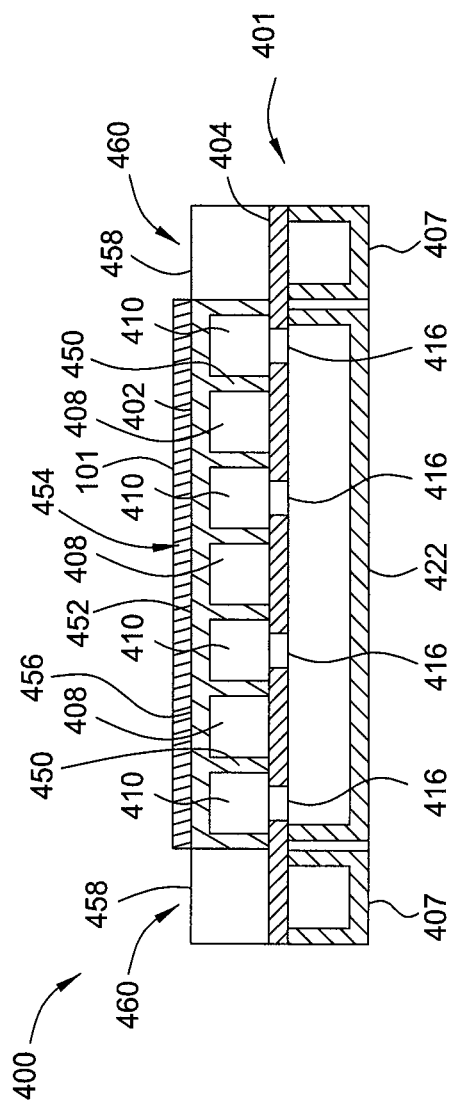
FIG. 4A illustrates a sectional view of a top plate, according to one embodiment.

FIG. 4A illustrates a cross sectional view of a support plate assembly 400, according to one embodiment. The support plate assembly 400 includes a body assembly 401 having a plurality of first fluid passages 408 and a plurality of second fluid passages 410. The first fluid passages 408 are configured to flow a heat transfer fluid in a first direction from a first end 414 of the body assembly 401 to a second end 415 of the body assembly 401. The second fluid passages 410 are configured to flow a heat transfer fluid in a second direction from the second end 415 to the first end 414. In one embodiment, the first and second fluid passages 408 run parallel to a long side of the body assembly 401. In another embodiment, the first and second fluid passages 408, 410 run perpendicular to the long side of the body assembly 401. The first fluid passages 408 are interleaved with the second fluid passages 410. Interleaving the first fluid passages 408 with the second fluid passages 410 provides flow path for heat transfer fluid arranged in alternating directions, thus configuring the support plate assembly 400 as a counter-flow heat exchanger. The alternating flow path for the heat transfer fluid allows for a more symmetric temperature control of the substrate support assembly 118, and ultimately, the substrate 101. The support plate assembly 400 may further include a plurality of return manifolds 406, and a plurality of supply conduits 407. The plurality of return manifolds 406 and the plurality of supply conduits 407 are coupled to the body assembly 401.

Figure 4B:
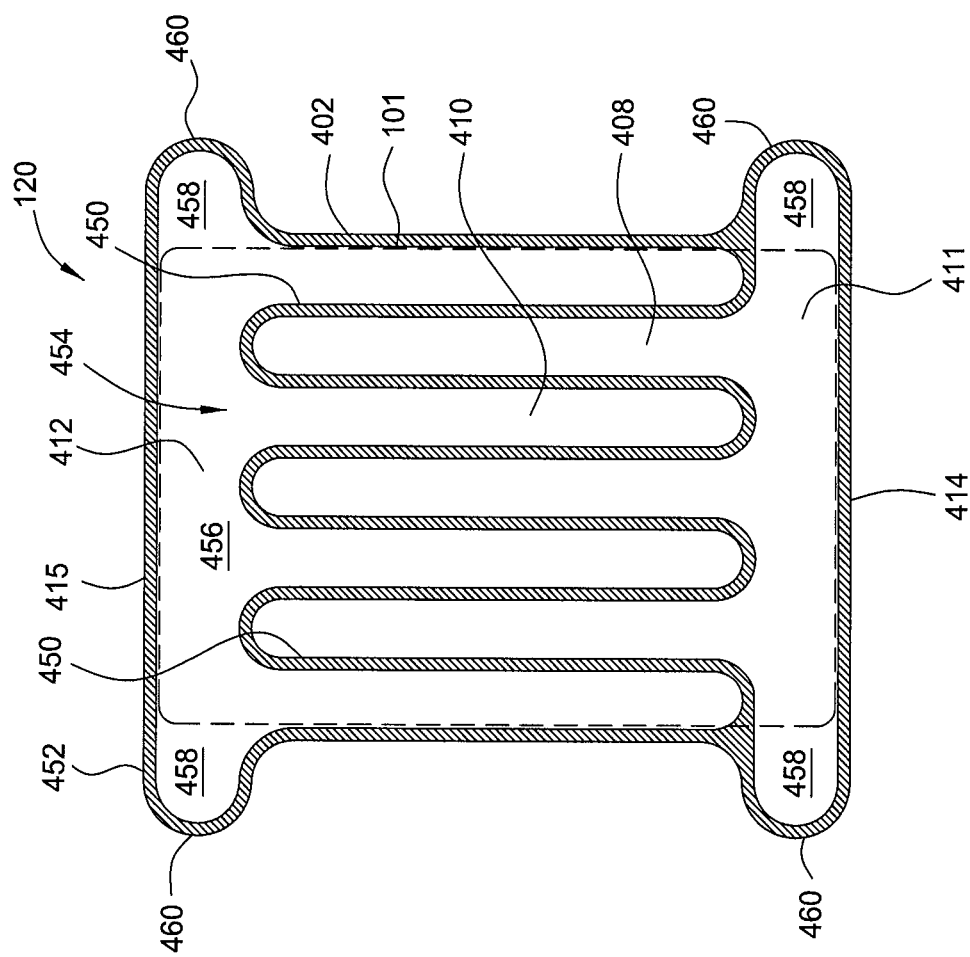
FIG. 4B illustrates a bottom cap of a support plate assembly, according to one embodiment.
Figure 4C:
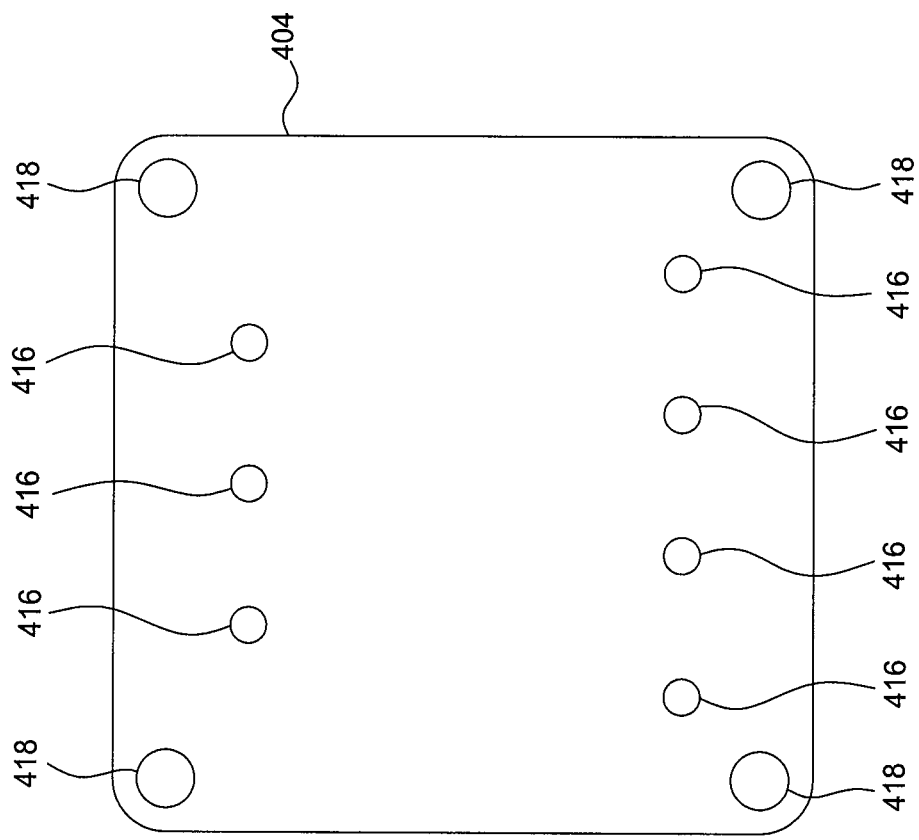
FIG. 4C illustrates fluid return manifolds and fluid supply conduits.

The body assembly 401 may further include a top plate (shown in detail in FIG. 4B) and a bottom plate 404 (shown in detail in FIG. 4C). The fluid passages 408, 410 may be formed in the top plate 402. In another embodiment, the plurality of fluid passages 408, 410 may be formed in the bottom plate 404. In yet another embodiment, a portion of the plurality of fluid passages 408, 410 may be formed in the top plate 402 and a portion of the plurality of fluid passages 408, 410 may be formed in the bottom plate 404.

FIG. 4B illustrates a cross-sectional top view of the top plate 402, according to one embodiment. The top plate 402 further includes a first fluid supply manifold 411 and a second fluid supply manifold 412. The first fluid supply manifold 411 is formed at the first end 414 of the top plate 402. The first fluid supply manifold 411 is in fluid is in communication with the plurality of first fluid passages 408. The second fluid supply manifold 412 is formed at the second end 415 of the top plate 402. The second fluid supply manifold 412 is in communication with the plurality of second fluid passages 410. The fluid supply manifolds 411, 412 and the fluid passages 408, 410 are bound by side walls 450 and a bottom wall 452.

The top plate 402 further includes a top surface 454. The top surface 454 comprises a substrate receiving area 456 and an outer area 458. The substrate receiving area 456 encompasses at least an area above the plurality of fluid passages 408, 410. The substrate receiving area 456 is configured to support a substrate during processing. Thus, the substrate receiving area 456 may be the same or slightly larger than an area of the substrate. The outer area 458 is exterior to the substrate receiving area 456. The outer area 458 includes a plurality of projections 460. The projections 460 allow for the supply conduits 407 to be positioned outside of, and along a same plane, as the return manifolds 406. Positioning the supply conduits 407 outside of the substrate receiving area 456 provides better and more uniform thermal contact as only the passages 408, 410 lie directly under the substrate receiving area 456. Positioning the supply conduits 407 outside of and within the same plane as the return manifolds 406 also allows for a thinner support plate assembly 400. The thinner support plate assembly 400 enables the support plate assembly 400 to be retrofitted into processing chambers where thicker support plate assemblies (i.e., where the supply conduits are beneath the return manifolds) are too thick for the available chamber stroke length.

The bottom plate 404 is coupled to the top plate 402. The bottom plate 404 is configured to seal the fluid passages 408, 410. In one embodiment, the bottom plate 404 may be brazed to the top plate 402. In other embodiments, the bottom plate 404 may be welded or coupled to the top plate 402 in another manner that prevents leakage from the fluid passages 408, 410. FIG. 4C illustrates a top view of the bottom plate 404, according to one embodiment. The bottom plate 404 may include a plurality of fluid outlets 416 and a plurality of fluid inlets 418. The fluid inlets 418 are positioned on the bottom plate 404 such that the fluid inlets 418 are in fluid communication with the first and second fluid supply manifolds 411, 412. The fluid outlets 416 are positioned on the bottom plate 404 such that the fluid outlets 416 are in fluid communication with the fluid passages 408, 410. The fluid outlets 416 are configured to provide fluid communication between the first and second fluid passages 408, 410 and the plurality of fluid return manifolds 406, such that the heat transfer fluid can exit the fluid passages 408, 410 into the fluid return manifolds 406.

Figure 4D:
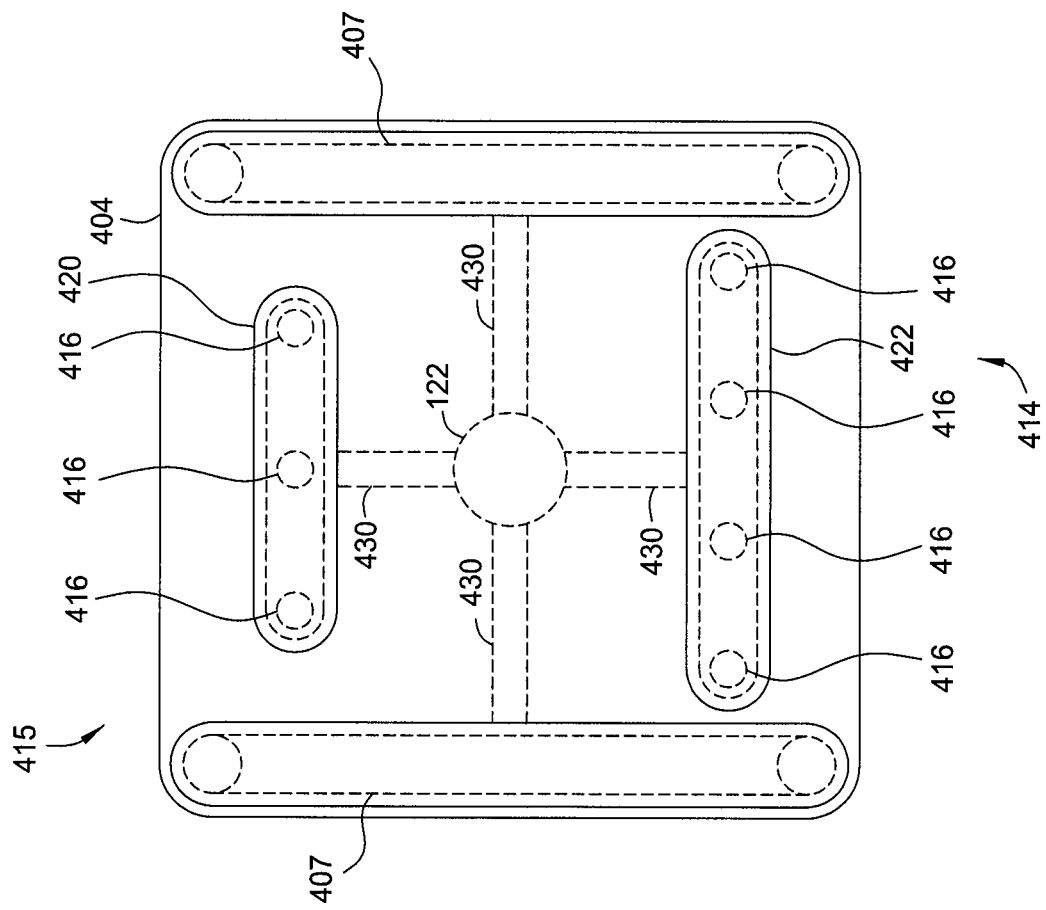
FIG. 4D illustrates a cross-sectional view of a support plate assembly.

FIG. 4D illustrates a bottom view of the support plate assembly 400 illustrating the fluid return manifolds 406 and the fluid supply conduits 407. The plurality of fluid return manifolds 406 are coupled to the bottom plate 404. The fluid return manifolds 406 and the fluid supply conduits 407 are fluidly coupled to the stem 122 via conduits 430. The plurality of fluid return manifolds 406 includes a first fluid return manifold 420 and a second fluid return manifold 422. The first fluid return manifold 420 is coupled to the bottom plate 404 near the second end 415 of the top plate 402. The second fluid return manifold 422 is coupled to the bottom plate 404 near the first end 414 of the top plate 402. The first and second fluid return manifolds 420, 422 are configured to receive the heat transfer fluid exiting the fluid passages 408, 410 from the fluid outlets 416 formed in the bottom plate 404.

The fluid supply conduits 407 are coupled to the bottom plate 404. The fluid inlets 418 are configured to provide fluid communication between the fluid supply conduits 407 and the first and second fluid supply manifolds 411, 412 such that heat transfer fluid may be provided to the first and second fluid supply manifolds 411, 412. As shown in FIG. 4A, the bottom plate 404 is configured to seal the first and second fluid supply manifolds 411, 412. Additionally, the bottom plate 404 may also be configured to seal the first and second fluid return manifolds 420 422.

In operation, the fluid flows from fluid supply conduits 407, through the fluid inlets 418, and into the first and second fluid supply manifolds 411, 412. The heat transfer fluid flows from the first fluid supply manifold 411 into the plurality of first fluid passages 408. The heat transfer fluid flows through the first fluid passages 408 and exits the first fluid passages 408 through the fluid outlets 416, into the first fluid return manifold 420. The heat transfer fluid also flows from the second fluid supply manifold 412 into the plurality of second fluid passages 410. The heat transfer fluid flows through the second fluid passages 410 and exits the second fluid passages 410 through the fluid outlets 416, into the second fluid return manifold 420. The fluid return manifolds 420, 422 flows the heat transfer fluid back down the stem 122.

In one embodiment, the top plate 402 has a thermal mass that is less than a thermal mass of the heat transfer fluid, such as water, provided to the fluid passages 408, 410. For example, the thermal mass of the top plate 402 is less than about 50% of the thermal mass of the heat transfer fluid. In another embodiment, the support plate assembly 400 has a thermal mass such that the thermal mass of the support plate assembly 400 is less than a thermal mass of the heat transfer fluid provided to the fluid passages 408, 410. For example, the thermal mass of the support plate assembly 400 is less than about 50% of the thermal mass of the heat transfer fluid, or stated differently, the thermal mass of the support plate assembly 400, when dry, that is less than twice a thermal mass of water when filled in the passages 408, 410. Having the thermal mass of either the top plate 402 or the support plate assembly 400 less than the thermal mass of the heat transfer fluid enables the temperature of the support plate assembly 400 to be rapidly changed, thus enabling rapid and more precise temperature control of the substrate disposed thereon. Additionally, the ability of the support plate assembly 400 to rapidly change temperature is enhanced by configuring the passages 408, 410 with low flow impedance. For example, the low flow impedance of passages 408, 410 enable the volume of the heat transfer fluid within the passages 408, 410 to be completely replaced in less than 5 seconds, for example, in less than 2 seconds without requiring high fluid pressure. By providing low flow impedance, the pressure required to force the fluid through the passages can be less and therefore the thickness of the walls of the passages and therefore the static thermal mass of the support assembly can be correspondingly lower.

Figure 3:
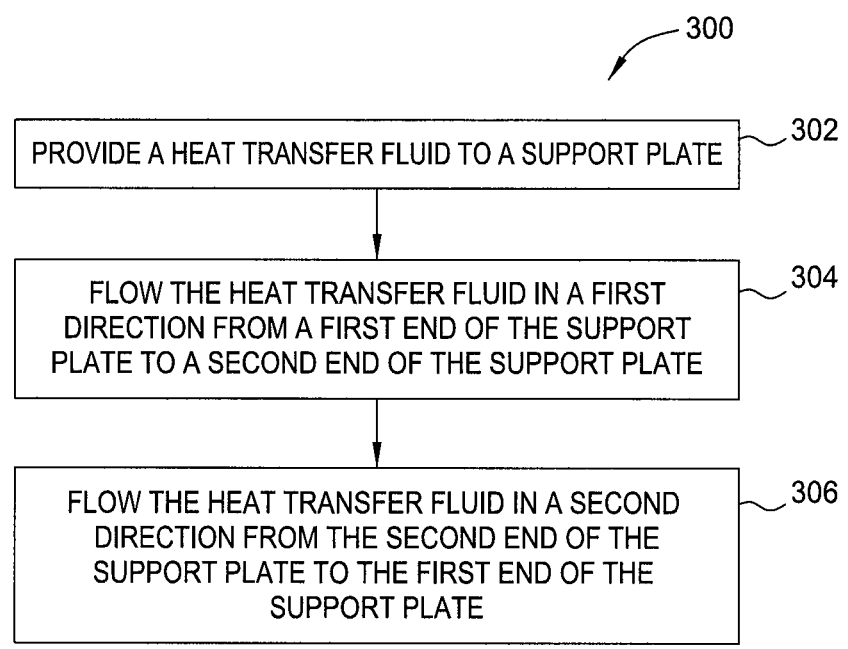
FIG. 3 is a flow diagram illustrating a method of controlling a temperature of a substrate support assembly, according to one embodiment.

FIG. 3 is a flow diagram illustrating a method 300 of controlling a temperature of a substrate support assembly, according to one embodiment. The method 300 begins at block 302 where a heat transfer fluid is provided to a support plate of the substrate support assembly. For example, the fluid may be provided to the support plate assembly 120 via the fluid supply conduit 202. The fluid supply conduit 202 provides the heat transfer fluid to a first fluid supply manifold 204 and a second fluid supply manifold 206.

At block 304, the heat transfer fluid is flowed in a first direction from a first fluid supply manifold disposed in a first end of the support plate to a first fluid return manifold disposed in a second end of the support plate. For example, the heat transfer fluid may be flowed in a first direction through a first fluid passage 220 from the first fluid supply manifold 204 to the first fluid return manifold 216.

At block 306, heat transfer fluid is flowed in a second direction from a second fluid supply manifold disposed in the second end of the support plate to a second fluid return manifold disposed in the first end of the support plate. For example, the heat transfer fluid may be flowed in a second direction through a second fluid passage 222 from the second fluid supply manifold 206 to the second fluid return manifold 218. The heat transfer fluid flowing in the first direction and the second direction is performed in an alternating manner along substantially the entire plan area of the support plate. When the heat transfer fluid reaches the first fluid return manifold 216 and the second fluid return manifold 218, the heat transfer fluid exits the support plate via the fluid exit conduit 214. Heat transfer fluid may be continually cycled through the support plate assembly 120 to control the temperature of the support plate assembly 120 during processing.

While the foregoing is directed to specific embodiments, other and further embodiments may be devised without departing from the basic scope thereof, and the scope thereof is determined by the claims that follow.

What is claimed is:

1. A substrate support assembly, comprising:
 a support plate assembly, comprising:
  a first fluid supply manifold positioned at a first end of the support plate assembly;
  a second fluid supply manifold positioned at a second end of the support plate assembly, the second end disposed opposite the first end;
  a first fluid return manifold positioned at the second end of the support plate assembly;
  a second fluid return manifold positioned at the first end of the support plate assembly;
  a plurality of first fluid passages extending from the first fluid supply manifold to the first fluid return manifold, each first fluid passage configured to flow fluid in a first direction, wherein each of the first fluid passages have an inlet and an outlet and each of the first fluid passages is independent from each of the other first fluid passages;
  a plurality of second fluid passages extending from the second fluid supply manifold to the second fluid return manifold, each second fluid passage configured to flow a fluid in a second direction that is opposite the first direction, wherein the first fluid passages and the second fluid passages extend across an upper surface of the support plate assembly in an approximately alternating manner, wherein the plurality of first fluid passages is independent to the plurality of second fluid passages, and wherein each of the second fluid passages have an inlet and an outlet and each of the second fluid passages is independent from each of the other second fluid passages; and
  a fluid supply conduit configured to supply a fluid to the first fluid supply manifold and the second fluid supply manifold.

2. The substrate support assembly of claim 1, wherein the support plate assembly further comprises:
 a thermal mass, when dry, that is less than twice a thermal mass of water when filled in the passages.

3. The substrate support assembly of claim 1, wherein the first fluid supply or return manifold, the second fluid supply or return manifold, the first fluid return or supply manifold, and the second fluid return or supply manifold are formed in a single plate, and wherein the single plate also contains the first and second fluid passages.

4. The substrate support assembly of claim 1, wherein the support plate assembly further comprises:
 a support plate having at least a portion of the passages formed therein; and
 a cap coupled to the support plate and sealing the passages.

5. The substrate support assembly of claim 4, wherein the cap further comprises:
 holes formed there through and fluidly coupling the passages with the first fluid supply manifold, the second fluid supply manifold, the first fluid return manifold, and the second fluid return manifold.

6. The substrate support assembly of claim 5, wherein the first supply manifold, the second fluid supply manifold, the first fluid return manifold, and the second fluid return manifold surround the fluid passages.

7. The substrate support assembly of claim 1, further comprising:
 a support plate having the passages formed therein and the manifolds coupled thereto.

8. A processing chamber, comprising:
 a chamber body comprising a top wall, a sidewall and a bottom wall defining a processing region in the chamber body; and
 a substrate support assembly disposed in the processing region, the substrate support assembly comprising:
  a support plate assembly, comprising:
   a first fluid supply or return manifold positioned at a first end of the support plate assembly;
   a second fluid supply or return manifold positioned at a second end of the support plate assembly, the second end disposed opposite the first end;
   a first fluid return or supply manifold positioned at the second end of the support plate assembly;
   a second fluid return or supply manifold positioned at the first end of the support plate assembly;
   a plurality of first fluid passages extending from the first fluid supply manifold to the first fluid return manifold, each first fluid passage configured to flow fluid in a first direction, wherein each of the first fluid passages have an inlet and an outlet and each of the first fluid passages is independent from each of the other first fluid passages;
   a plurality of second fluid passages extending from the second fluid supply manifold to the second fluid return manifold, each second fluid passage configured to flow a fluid in a second direction that is opposite the first direction, wherein the first fluid passages and the second fluid passages extend across an upper surface of the support plate assembly in a generally alternating manner, and wherein each of the second fluid passages have an inlet and an outlet and each of the second fluid passages is independent from each of the other second fluid passages; and
   a fluid supply conduit configured to supply a fluid to the first fluid supply or return manifold and the second fluid supply or return manifold.

9. The processing chamber of claim 8, wherein the support plate assembly further comprises:
 a thermal mass, when dry, that is less than about two times a thermal mass of water filling the passages.

10. The processing chamber of claim 8, wherein the first fluid supply or return manifold, the second fluid supply or return manifold, the first fluid return or supply manifold, and the second fluid return or supply manifold are formed in a single plate, and wherein the single plate also contains the first and second fluid passages.

11. The processing chamber of claim 10, wherein the support plate assembly further comprises:
 a support plate having at least a portion of the passages formed therein; and a cap coupled to the support plate and sealing the passages.

12. The processing chamber of claim 11, wherein the cap further comprises:
holes formed there through and fluidly coupling the fluid passages with first fluid supply manifold, the second fluid supply manifold, the first fluid return manifold, and the second fluid return manifold.

13. The processing chamber of claim 12, wherein the first supply manifold, the second fluid supply manifold, the first fluid return manifold, and the second fluid return manifold surround the fluid passages.

14. The processing chamber of claim 8, further comprising:
a support plate having the passages formed therein and the manifolds coupled thereto.

15. The processing chamber of claim 8, wherein each of the first fluid passages have an inlet and an outlet and each of the first fluid passages is independent from each of the other first fluid passages.

16. A substrate support assembly, comprising:
a support plate assembly, comprising:
a first fluid supply manifold positioned at a first end of the support plate assembly;
a second fluid supply manifold positioned at a second end of the support plate assembly, the second end disposed opposite the first end;
a first fluid return manifold positioned at the second end of the support plate assembly;
a second fluid return manifold positioned at the first end of the support plate assembly;
a plurality of first fluid passages extending from the first fluid supply manifold to the first fluid return manifold, each first fluid passage configured to flow fluid in a first direction, wherein each of the first fluid passages have an inlet and an outlet and each of the first fluid passages is independent from each of the other first fluid passages;
a plurality of second fluid passages extending from the second fluid supply manifold to the second fluid return manifold, each second fluid passage configured to flow a fluid in a second direction that is opposite the first direction, wherein the first fluid passages and the second fluid passages extend across an upper surface of the support plate assembly in an approximately alternating manner, wherein the plurality of first fluid passages is independent to the plurality of second fluid passages, and wherein each of the second fluid passages have an inlet and an outlet and each of the second fluid passages is independent from each of the other second fluid passages;
a fluid supply conduit configured to supply a fluid to the first fluid supply manifold and the second fluid supply manifold; and
a support plate having the passages formed therein.

17. The substrate support assembly of claim 16, wherein the support plate assembly further comprises a cap coupled to the support plate and sealing the passages.

18. The substrate support assembly of claim 17, wherein the cap further comprises holes formed there through and fluidly coupling the passages with the first fluid supply manifold, the second fluid supply manifold, the first fluid return manifold, and the second fluid return manifold.

19. The substrate support assembly of claim 18, wherein the first supply manifold, the second fluid supply manifold, the first fluid return manifold, and the second fluid return manifold surround the fluid passages.

20. The substrate support assembly of claim 16, wherein the manifolds are coupled to the support plate.

\* \* \* \* \*